United States Patent
Trauth et al.

(10) Patent No.: US 8,649,527 B2
(45) Date of Patent: Feb. 11, 2014

(54) AMPLIFIER CIRCUIT, ELECTRONIC DEVICE, METHOD FOR CONFIGURING AN AMPLIFIER CIRCUIT

(75) Inventors: Gerhard Trauth, Muret (FR); Ludovic Oddoart, Frouzins (FR)

(73) Assignee: Freescale Semiconductor, Inc., Austin, TX (US)

( * ) Notice: Subject to any disclaimer, the term of this patent is extended or adjusted under 35 U.S.C. 154(b) by 756 days.

(21) Appl. No.: 12/747,717

(22) PCT Filed: Dec. 14, 2007

(86) PCT No.: PCT/IB2007/055400
§ 371 (c)(1),
(2), (4) Date: Jun. 11, 2010

(87) PCT Pub. No.: WO2009/077816
PCT Pub. Date: Jun. 25, 2009

(65) Prior Publication Data
US 2010/0289570 A1    Nov. 18, 2010

(51) Int. Cl.
*H04R 3/00* (2006.01)
*H04R 27/00* (2006.01)

(52) U.S. Cl.
USPC .............................................. 381/81; 381/85

(58) Field of Classification Search
USPC ............ 381/150, 94.5, 120–123; 330/51, 250
See application file for complete search history.

(56) References Cited

U.S. PATENT DOCUMENTS

| | | |
|---|---|---|
| 5,875,250 A | 2/1999 | Kuo et al. |
| 2006/0152281 A1* | 7/2006 | May .............................. 330/251 |
| 2006/0159292 A1* | 7/2006 | Guilbert ........................ 381/120 |
| 2007/0024361 A1* | 2/2007 | Krishnan et al. .............. 330/123 |
| 2008/0061876 A1* | 3/2008 | Kaya et al. ................. 330/207 P |

FOREIGN PATENT DOCUMENTS

| | | |
|---|---|---|
| EP | 0080771 A | 6/1983 |
| EP | 0866638 A | 9/1998 |
| WO | 2006/078378 A | 7/2006 |

OTHER PUBLICATIONS

Freescale Semiconductor: "MC13783 Power Management and Audio Circuit" Freescale Semiconductor Data Sheet: Technical Data, Document No. MC13783 Rev. 3.5, Jul. 2009, pp. 1-50.
Texas Instrument: TPS9104 "Cellular Subscriber Terminal Power Supply/Audio System" SLVS133—Aug. 1996, POBox 655303, Dallas, TX 75265, pp. 1-33.
Wolfson Microelectronics: WM8753L "Hi-Fi and Telephony Dual Codec" Advanced Information, Jun. 2004, Rev 3.1, www.wolfsonmicro.com, pp. 1-88.
Texas Instrument: TWL3034 "OMAP-Vox Single-Chip Solution for Affordable Multimedia-Rich Phones" 2008 Texas Instruments Incorporated, OMAP-Vox Solutions, (SWPT021A) pp. 1-4.

(Continued)

*Primary Examiner* — Fan Tsang
*Assistant Examiner* — Eugene Zhao

(57) ABSTRACT

An electronic circuit comprises one or more upstream stages and two or more downstream stages positioned, in a processing direction of the signals, downstream of the upstream stage. A plurality of configurable connections is present between the upstream stage and the downstream stages. The connections are configurable to provide a predetermined communication path between a respective upstream stage and one or more selected downstream stage selected from the two or more downstream stages and to communicatively disconnect the upstream stage from not selected downstream stages. The electronic circuit may for example be an amplifier circuit.

20 Claims, 3 Drawing Sheets

(56) References Cited

OTHER PUBLICATIONS

Infineon Technologies: S-Gold2 PMB8876 "PMB8876 S-Gold2—Multimedia Engine with Advanced EDGE Modem Functionality" Infineon Technologies AG, St.-Martin-Strasse 53, D-81669, Munchen, 2004, pp. 1-3.

International Search Report and Written Opinion Correlating to PCT/IB2007/055400 dated Nov. 4, 2008.

* cited by examiner

AMPLIFIER CIRCUIT, ELECTRONIC DEVICE, METHOD FOR CONFIGURING AN AMPLIFIER CIRCUIT

FIELD OF THE INVENTION

This invention relates to an amplifier circuit, to an electronic device and to a method for configuring an amplifier circuit.

BACKGROUND OF THE INVENTION

Audio devices, such as mobile phones, multimedia players, Personal Digital Assistants, game consoles or other types of audio devices, are known in the art. Such devices typically include one or more amplifier circuits which are able to amplify different types of audio signals for different audio amplification functions. For example, for mobile phones, the main audio amplification functions are for the following use cases:

emitting a ring tone to alert the user of an incoming call by means of a loudspeaker or allowing hands free operation through a loudspeaker;

allowing the user to hear through a dedicated earpiece during a voice call;

hearing a conversation or music through a headset;

sending a music signal to an external unit through a line out path.

For each acoustic transducer used by the audio amplification function, a separate power amplifier is present which drives the corresponding signal to the respective transducer.

Thus, in case of three audio amplification functions, of which two require a stereo output and hence use two transducers each, a total of five power amplifiers is required, even if not all the functions are active at the same time. This consumes a significant amount of die space in case the amplifier circuit is implemented as a semiconductor device and/or results in a relatively high power consumption.

SUMMARY OF THE INVENTION

The present invention provides an amplifier circuit, an electronic device and a method for configuring an amplifier circuit as described in the accompanying claims.

Specific embodiments are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the accompanying drawings, in which.

DETAILED DESCRIPTION OF THE PREFERRED EMBODIMENTS

Figure 1:
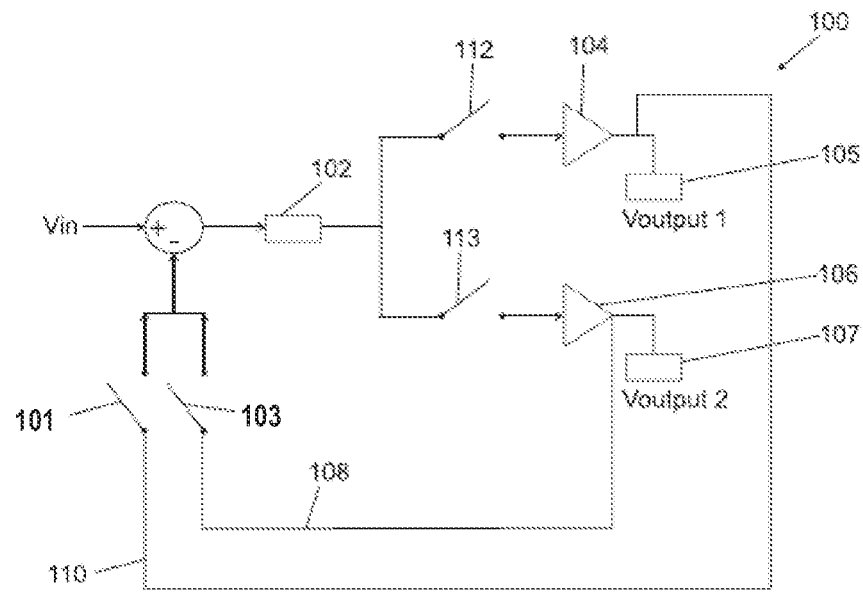
FIG. 1 is a circuit diagram of a first example of an embodiment of an amplifier circuit.

In the following, amplifier circuits for use in power amplification of audio signals will be described as examples of an electronic circuit. The amplifier circuit may be used to amplify audio signals (Vin, Vinl, Vinr)) in an audio device, such as a mobile phone, a multimedia player, a Personal Digital Assistant, a game console or other suitable type of audio device. The examples of an amplifier circuit shown may be implemented as a Class D power amplifier, by way of an example only. However, will be apparent that the amplifier circuit may be any other suitable type of amplifier. Furthermore, it will be apparent that the electronic circuit may be implemented as a different type of circuit, such as a DC-DC converter or other suitable type of circuit and may be used in any other suitable types of applications.

As shown in the figures, amplifier circuits 100 and 200 may comprise one or more upstream stages 102, 202 and two or more downstream stages 104, 106, 114, 116. The upstream stages and the downstream stages may form a multi-stage amplifier, such for example a switching amplifier, such as a Class C amplifier, a Class D amplifier or a non-switched amplifier, such as a Class A, Class A/B or Class B amplifier.

The downstream stages 104, 106, 114, 116 may be positioned, in a processing direction of the audio signals, downstream of the upstream stage 102, 202. The upstream stage may for example be an input stage and/or the downstream stages may be output stages of the multi-stage amplifier. As shown, the upstream stages 102,202 may be directly connected to the downstream stages 104, 106, 114, 116, in which case a signal outputted by an upstream stage will not be subjected to further signal processing before being processed by the output stage an the multi-stage amplifier is a two-stage amplifier.

In this example, for instance, each of the upstream stages 102, 202 is a core stage of the amplifier, from hereon referred to as an amplifier core, whereas the downstream stages are power output stages of the amplifier. The upstream stages may for example perform non-amplifying functions, such as switching and pulse-width modulation or other signal shaping functions, whereas the downstream stages may perform a power amplification of the signal outputted by a respective upstream stage.

As shown in the examples, a plurality of configurable connections 112, 113 may be present between the upstream stage 102,202 and the downstream stages 104, 106, 114, 116. The connections may be configurable in order to provide, depending on a type of the audio signals, a predetermined communication path between a respective upstream stage 102,202 and one or more selected downstream stages selected from the two or more downstream stages 104, 106, 114, 116 and to communicatively disconnect the upstream stage from not selected downstream stages.

Thereby, for example, the number of upstream stage present and/or active may be reduced. Thereby, the footprint of the amplifier circuit, and hence the amount of die size required, and/or the power consumption may be reduced. For example, the same upstream stage may be used for different amplification functions and e.g. depending on the type of signal be connected to a different downstream stage and/or an upstream stage may be shared by two or more downstream stages. Furthermore, the amplifier circuit can be more flexible because the paths may be changed by configuring the connections. For instance, for a first application function, the connections may be configured to provide a first path and for a second amplification function, the connections may be configured to provide a second path. Depending on the desired function, a corresponding configuration may then be selected. The configuration may for example be pre-set of be selected dynamically, i.e. in use. For example, the configuration may be changed when the function changes, e.g. when a user switches from an earpiece to a hand-free operation of a mobile phone.

Figure 2:
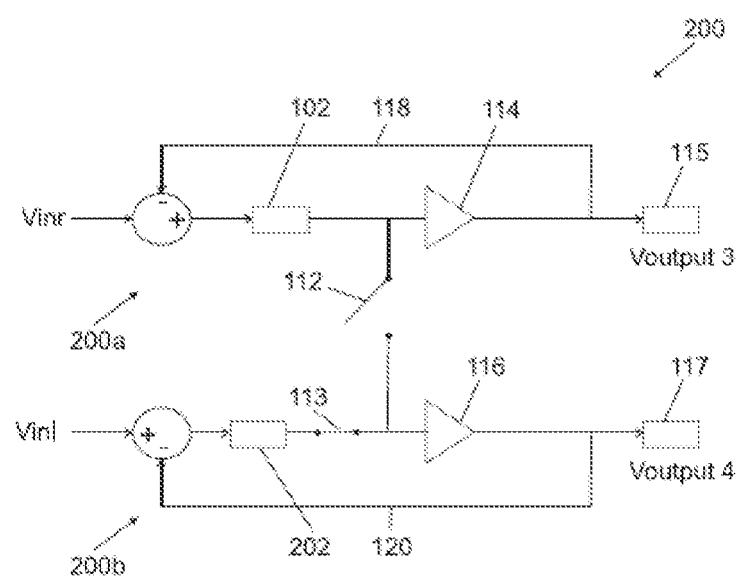
FIGS. 2-4 are circuit diagrams of a second example of an embodiment of an amplifier circuit in which the connections are configured for a stereo-mode and mono-modes respectively.
Figure 3:
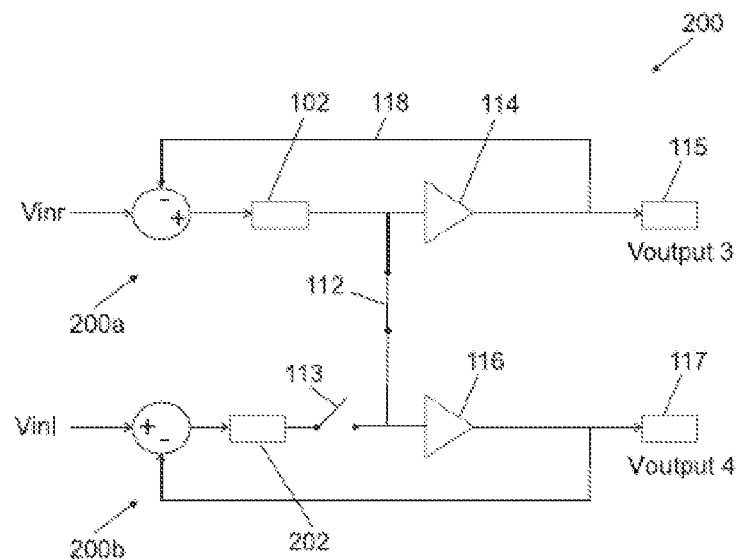

For instance, in the example of FIG. 2, for the upstream stage 202 the downstream stage 116 is selected and for the upstream stage 102 the downstream stage 114 is selected, whereas in the example of FIG. 3, no downstream stage is selected for the upstream stage 202 and for the upstream stage 102 the downstream stages 114,116 are both selected.

Referring to FIG. 1, the example a representation of an amplifier circuit 100 shown therein which can be used for two or more amplification functions sequentially, such as first amplifying a signal for a mono-loudspeaker and then amplifying a mono-signal for an earpiece for a mobile phone or vice versa. The mono-loudspeaker may for example be used to emit a ring tone to alert the user of an incoming call refers to the ringing application or to allow hands free operation. The earpiece may for example be used to allow a user to hear a voice call.

As shown in FIG. 1, an amplifier core 102, which forms the upstream stage in this example, may be connected via a respective connection to two, or more, different downstream stages in parallel. As shown, the number of upstream stages is less than the number of downstream stages. Thus, the footprint of the amplifier circuit 100 may be reduced relative to an amplifier circuit which use a separate amplifier core for each amplifier application to be supported.

The amplifier core 102 may be a standard Class D amplifier core, which may comprise for example a sigma delta modulator, a pulse width modulation module, be a dedicated core for a class AB upstream stage, or any other appropriate type of amplifier core.

In this example, the downstream stages are power output stages 104, 106. The power output stage 104 may for instance be a power output stage which drives a loudspeaker 105. The power output stage 104 may for example have a maximum output power of 500 mW on the output (Voutput 1) to drive the loudspeaker 105. The power output stage may for example drive an earpiece speaker 107. The downstream stage 106 may for instance be able to release a power of 30 mW on the output (Voutput 2), to drive the earpiece speaker 107.

As shown, switches 112 and 113 may be present in the connections between the amplifier core 102 and the power output stages 104, 106. The switches 112,113 may enable in a closed state a communication via the respective connection to a selected power output stage 104 resp. 106 or disable in an open state the communication via the connection to a non-selected power output stage, depending on the desired configuration.

For instance, for a certain period of time the switch 112 may be open while the switch 113 is closed, thus providing a path between the amplifier core 102 and the power output stage 106, thereby providing an amplified signal to the earpiece speaker 107. For another period of time, the switch 113 may be open while the switch 112 is closed, thus providing a path between the amplifier core 102 and the power output stage 104, thereby providing an amplified signal to the mono-loudspeaker 105. Thus, the example of an amplifier circuit 100 shown in FIG. 1, allows use of either the earpiece speaker (e.g. for a voice call) or the mono-loudspeaker for ringing or hands free operation.

As shown, the output of the power output stage 104 may be connected to the input of the amplifier core 102 via a corresponding mono-loudspeaker feedback circuit 110. The feedback circuit 110 returns the amplified signal outputted by the power output stage 104 to the input of the amplifier core 102. The output of the power output stage 106 may be connected via a corresponding earpiece speaker feedback circuit 108 to the input of the amplifier core 102. The feedback circuit 108 returns the output signal of the power output stage 106 to the input of the amplifier core 102. As shown, the feedback circuits 108,110 may comprise switches 103, 101, respectively, which can enable or disable the respective feedback circuit 108,110.

The shown example may for instance operate as follows. An input signal, such as, an audio signal, may be presented to the input of the circuit 100, such as a voltage signal Vin. The input signal may for example be an analog signal or a digital signal. Although other values may also be used, the frequency of the input signal may for instance be about 20 kHz with a voltage peak of approximately 1V.

If the input signal is a signal intended for the mono-loudspeaker 105, e.g. when the input signal is a ring tone or a voice signal which is to be outputted in hands-free mode, then the input signal is to pass in this example through the amplifier core 102 and the power stage 104, which is thus the selected downstream stage. Thus, the switch 112 between the amplifier core 102 and the power stage 104 may be put in the closed state, in order to provide a suitable path for the input signal. The switch 101 in the feedback path 110 may be put in the closed state, in order to close the feedback loop 110.

If the input signal is a signal intended for the earpiece speaker, e.g. when the input signal is a voice signal, then the input signal is to pass in this example through the amplifier core 102 and the power stage 106, which is thus the, only, selected downstream stage. Thus, the switch 113 between the amplifier core 102 and the power stage 106 may be put in the closed state, in order to provide a suitable path for the input signal. It will be apparent, that in use the desired transducer 105,107 may be changed, that the configuration may be changed and that the connections may be enabled/disabled correspondingly.

FIG. 2 shows an example of an amplifier circuit 200 which may be used in both a stereo application or in a mono-application. As shown in FIG. 2, the circuit 200 may comprise a number of upstream stages 102,202 which is at least equal to the number of downstream stages. The shown example may for instance be switched between a configuration for a stereo application and a configuration for a mono-application.

The amplifier circuit 200 may, as shown, include two or more upstream stages and two or more outputs. In this example, each output is connected to a different acoustic transducer. As explained below, the connections may be configured to provide, in a stereo-signal mode, two or more communication paths, each of the communication paths connecting a respective upstream stage to a set of one or more selected downstream stages, the set being different for each upstream stage. Thus, the upstream stages can each process a signal independent from the signal processed by another upstream stage.

In the example of FIG. 2, the connections are configured in the stereo mode such that the circuit 200 includes two (or more) similar amplifier sections 200a and 200b. The sections 200a and 200b are connected to each other via a connection which includes a switch 112 located between the two circuits 200a and 200b. In case of a stereo signal, a respective amplifier section 200a may be used to process a right input signal Vinr. The other section 200b may be used to process a left input signal Vinl. The sections 200a, 200b may thus obtain output signals Voutput3, Voutput4 to drive a right loudspeaker 115 and a left loudspeaker 117 respectively. As shown in FIG. 2, in such a case the switch 112 may be opened. Accordingly, in this use case, the signals Vinr and Vinl are separately processed in their respective circuits 200a, 200b and the loudspeakers 115,117 may be driven by separate signals in order to provide a stereo output. The power output stage 114 may for example able to release a power of 500 mW to drive the right loudspeaker 115. The power output stage 116 may for example able to release a power of 500 mW to drive the left loudspeaker 117.

Figure 4:
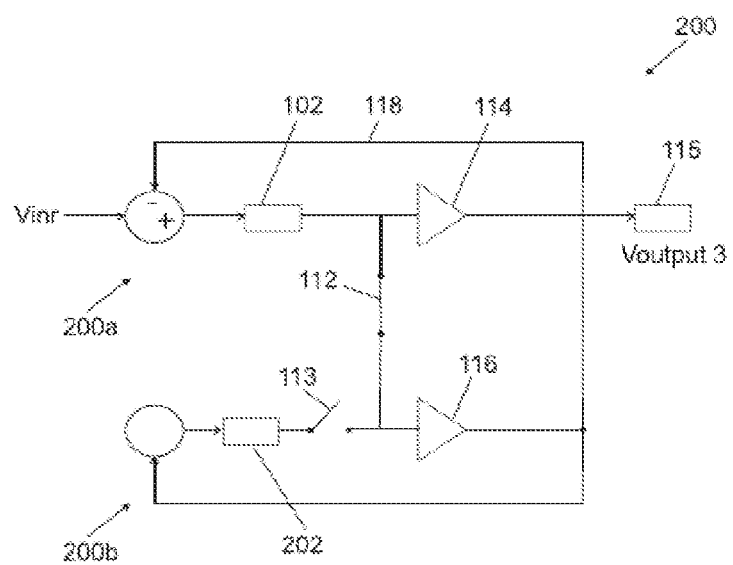

In the example of FIGS. 2-4, each amplifier section 200a, 200b comprises an amplifier core 102, 202 and a power output stage 114, 116. The amplifier section 200b includes a switch 113 in the connection in between the amplifier core 202 and the power output stage 116. Each amplifier section 200a, 200b may also comprise a respective feedback circuit 118, 120 which connects the output of the power stage to the input of the amplifier core in the respective amplifier section 200a, 200b in order to feed back the respective output signal to the input of the corresponding amplifier core 102 and 202.

FIG. 3 illustrates the use of the example of FIG. 2 in a mono-signal mode. As shown, the connections between the amplifier core 102 and the power output stages 114, 116 are configured to provide, in the mono-signal mode, a communication path which connects an upstream stage, i.e. the amplifier core 102 in this example, to two or more selected downstream stages 114, 116. In FIG. 3, the switch 112 is closed and the switch 113 is opened. Thus, the input signal Vinr is processed through one amplifier core 102 in to two power output circuits 114 and 116, resulting in a mono signal having two different outputs. In this example, each output is connectable to a different acoustic transducer, e.g. to each to a different loudspeaker 115 resp, 117.

FIG. 4 illustrates another configuration of the example shown in FIG. 2 suitable for a mono-signal mode. In this example, the selected downstream stages 114,116 are connected to the same output. Thereby, the amount of output power may be increased and the resistance of the speaker be reduced. In this example, the switch 112 is closed and the switch 113 is opened. Thus, the connection between the amplifier core 202 and the power output stage 116 is disabled and a path is provided between the amplifier core 102 and both power output stages 114,116. Thus, the input signal Vinr can be processed in the amplifier core 102, which then outputs the processed signal to both selected downstream stages 114, 116.

The downstream stages 114,116 drive the same transducer 115, which may for example be a mono-loudspeaker 115. A value for the amount of power to be released by the stages 114,116 suitable for driving each an 8Ω speaker is found to be about 500 mW, Therefore, having both downstream stages 114 and 116 connected in parallel to the same speaker, allows the circuit 200 to drive a 4Ω speaker releasing 1 W.

Figure 5:
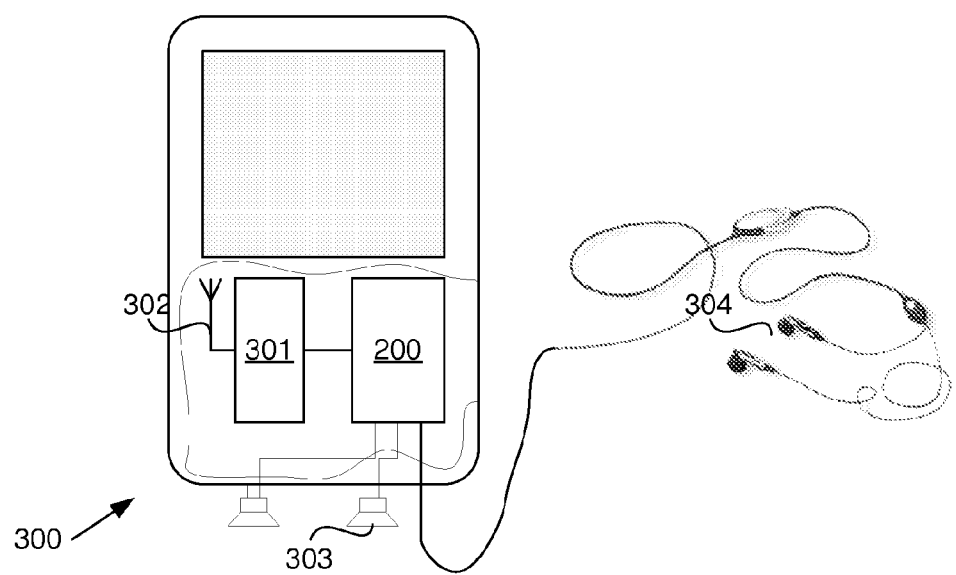
FIG. 5 schematically shows a perspective view of an example of an embodiment of an electronic device.

The amplifier circuit 200 may be implemented as an audio amplifier, that is an amplifier which amplifies signals composed primarily of frequencies between 20 hertz to 20,000 Hertz, such as low-power audio signals to a level suitable for driving loudspeakers and is suitable as the final stage in a typical audio playback chain connected to the loudspeakers. Referring to FIG. 5, the amplifier circuit 200 may for example, depending form part of an audio circuit for a set of two or more loudspeakers. The audio circuit may include a signal processing unit such as a suitably programmed microprocessor 301. The signal processing unit may for example perform, in operation, functions like pre-amplification, equalization, tone control, mixing/effects and may be connected with a signal processing input to sources of audio signals such as one or more of: radio receiver, optical disk players, non-volatile memory with audio data stored thereon or other suitable source of audio signals.

Referring to FIG. 5, an example of an apparatus 300 is shown. The apparatus 300 may include one or more inputs for receiving input signals. In this example, the inputs is connected to a microprocessor 301 which is connected to an antenna 302 via which electro-magnetic signals may be received. The received signals may be processed by the microprocessor and be outputted to the amplifier circuit 200. The apparatus 300 may have two or more outputs for outputting amplified audio signals, depending on the desired function and associated configuration, for example to drive an earpiece speaker 304, a stereo loudspeaker 303 or other acoustic transducer. Each of the outputs may be connected to a respective downstream stage of the amplifier circuit 200.

For example, in case the electronic device is a mobile phones or the like, the audio amplification functions of such devices are include one or more of:

emitting a ring tone to alert the user of an incoming call by means of the loudspeaker amplifier or allowing hands free operation through a loudspeaker amplifier (in which case the same amplifier may be used for both audio amplification functions); allowing the user to hear through a dedicated earpiece amplifier during a voice call; hearing a conversation or music through a headset amplifier; sending a music signal to an external amplifier through a line out path. The connections of the amplifier circuit 200 may be configured to provide a communication path corresponding to and depending on an active audio output function. For example, in a non-volatile memory, e.g. in the microprocessor 301, a configuration of the connections may be stored, and depending on the desired function a suitable configuration may be selected.

In the foregoing specification, the invention has been elucidated with reference to specific examples of embodiments of the invention. It will, however, be evident that various modifications and changes may be made therein without departing from the broader spirit and scope of the invention as set forth in the appended claims.

Also, the connections may be a type of connections suitable to transfer signals from or to the respective nodes, units or devices, for example via intermediate devices. Accordingly, unless implied or stated otherwise the connections may for example be direct connections or indirect connections.

Also, the invention is not limited to physical devices or units implemented in non-programmable hardware but can also be applied in programmable devices or units able to perform the desired device functions by operating in accordance with suitable program code. For instance, a computer program product comprising instructions for configuring the connections may be provided. For example, the computer program product may be implemented to configure a plurality of configurable connections between the upstream stage of the amplifier circuit and two or more downstream stages, positioned in a processing direction downstream of the upstream stage. Thereby, a predetermined communication path between a respective upstream stage and one or more predetermined selected downstream stage selected from the two or more downstream stages may be provided depending on a type of audio signals. The upstream stage may then be communicatively disconnected from the not selected downstream stages.

Furthermore, the devices may be physically distributed over a number of apparatus, while functionally operating as a single device. For example, an amplifier core or other stage may be implemented as a number of discrete devices connected to each other in a manner which enables the devices operate as the amplifier core or another type of stage.

Also, devices functionally forming separate devices may be integrated in a single physical device. For example, the upstream stage and the downstream stage may be implemented on the same die or in the same integrated circuit package.

The invention claimed is:

1. A switching amplifier circuit for amplifying audio signals, comprising:
    at least one upstream stage, comprising an output, for signal shaping said audio signals;
    at least two downstream stages, each downstream stage comprising an input and an output, comprising a first downstream stage and a second downstream stage, and positioned, in a processing direction of said audio signals, downstream of said upstream stage, for power amplification of signals outputted by said upstream stage;
    a plurality of configurable connections between said upstream stage and said downstream stages of the switching amplifier circuit, said connections being configurable to provide a predetermined communication path between the output of the upstream stage and the input of two selected downstream stages comprising the first downstream stage and the second downstream stage, and to communicatively disconnect the upstream stage from not selected downstream stages.

2. A switching amplifier circuit as claimed in claim 1, wherein said upstream stage and said downstream stages form Class D amplifiers.

3. A switching amplifier circuit as claimed in claim 1, including at least one output connectable to an acoustic transducer, and wherein at least two selected downstream stages are connected to the same output.

4. A switching amplifier circuit as claimed in claim 1, including at least two outputs, each output being connectable to a different acoustic transducer, and wherein said selected downstream stages are not connected to the same outputs.

5. A switching amplifier circuit as claimed in claim 1, comprising:
    at least two upstream stages and at least two outputs, each output being connectable to a different acoustic transducer; and
    wherein said connections are configured to provide, in a first mode, at least two communication paths, each of said communication paths connecting a respective upstream stage to a set of at least one selected downstream stage, said set being different for each upstream stage.

6. A switching amplifier circuit as claimed in claim 1, wherein the number of upstream stages is less than the number of downstream stages.

7. A switching amplifier as claimed in claim 1, wherein the number of upstream stages is at least equal to the number of downstream stages.

8. A switching amplifier circuit as claimed in claim 1, wherein a connection of the said connections includes a switch for enabling, in a closed state, a communication via said connection or disabling, in an open state, the communication via said connection.

9. A switching amplifier circuit a claimed in claim 1, wherein said upstream stage is an input stage and said at least two downstream stages are output stages.

10. A switching amplifier circuit as claimed in claim 1, said switching amplifier circuit having at least two application functions and wherein a configuration of said connections is selected depending on a desired function.

11. A switching amplifier circuit as claimed in claim 1, including a non-volatile memory for storing a configuration of said connections.

12. An apparatus comprising:
    at least one input for receiving input signals;
    a switching amplifier circuit as claimed in claim 1, for amplifying said input signals;
    at least two outputs for outputting amplified signals, each of said outputs being connected to a respective downstream stage of said amplifier circuit.

13. An apparatus as claimed in claim 12, wherein:
    said input signals are audio signals;
    said outputs are connectable to an acoustic transducer;
    said apparatus having at least two audio output functions; and
    said connections of said amplifier circuit are configured to provide a communication path corresponding to and depending on an active audio output function.

14. A method of configuring a switching amplifier circuit for amplifying audio signals, comprising:
    configuring depending on a type of signals to be amplified, a plurality of configurable connections between an upstream stage, comprising an output, of said switching amplifier, said upstream stage being arranged to perform signal shaping on said audio signals, and at least two downstream stages each downstream stage comprising an input and an output, comprising a first downstream stage and a second downstream stage, for power amplification of signals outputted by said upstream stage, said downstream stages being positioned in a processing direction of said audio signals downstream of said upstream stage, in order to provide a predetermined communication path between the output of the upstream stage and the input of two selected downstream stages comprising the first downstream stage and the second downstream stage, and to communicatively disconnect the upstream stage from not selected downstream stages.

15. A switching amplifier circuit as claimed in claim 2, comprising:
    at least two upstream stages and at least two outputs, each output being connectable to a different acoustic transducer; and
    wherein said connections are configured to provide, in a first mode, at least two communication paths, each of said communication paths connecting a respective upstream stage to a set of at least one selected downstream stage, said set being different for each upstream stage.

16. A switching amplifier circuit as claimed in claim 2, wherein the number of upstream stages is less than the number of downstream stages.

17. A switching amplifier as claimed in claim 2, wherein the number of upstream stages is at least equal to the number of downstream stages.

18. A switching amplifier circuit as claimed in claim 2, including at least one output connectable to an acoustic transducer, and wherein at least two selected downstream stages are connected to the same output.

19. A switching amplifier circuit as claimed in claim 2, including at least two outputs, each output being connectable to a different acoustic transducer, and wherein said selected downstream stages are not connected to the same outputs.

20. A switching amplifier circuit as claimed in claim 2, wherein said connection includes a switch for enabling, in a closed state, a communication via said connection or disabling, in an open state, the communication via said connection.

* * * * *